US009458554B2

(12) United States Patent
Mueller et al.

(10) Patent No.: US 9,458,554 B2
(45) Date of Patent: Oct. 4, 2016

(54) SEMICONDUCTOR WAFER COMPOSED OF MONOCRYSTALLINE SILICON AND METHOD FOR PRODUCING IT

(71) Applicant: Siltronic AG, Munich (DE)

(72) Inventors: Timo Mueller, Burghausen (DE); Gudrun Kissinger, Lebus (DE); Dawid Kot, Kunice (DE); Andreas Sattler, Trostberg (DE)

(73) Assignee: Siltronic AG, Munich (DE)

( * ) Notice: Subject to any disclaimer, the term of this patent is extended or adjusted under 35 U.S.C. 154(b) by 93 days.

(21) Appl. No.: 13/949,342

(22) Filed: Jul. 24, 2013

(65) Prior Publication Data

US 2014/0044945 A1     Feb. 13, 2014

(30) Foreign Application Priority Data

Aug. 8, 2012   (DE) .................. 10 2012 214 085

(51) Int. Cl.
| | |
|---|---|
| *C30B 15/14* | (2006.01) |
| *C30B 33/02* | (2006.01) |
| *C30B 29/06* | (2006.01) |
| *C30B 15/00* | (2006.01) |

(Continued)

(52) U.S. Cl.
CPC ............... *C30B 33/02* (2013.01); *C30B 15/00* (2013.01); *C30B 15/04* (2013.01); *C30B 15/14* (2013.01); *C30B 15/203* (2013.01); *C30B 29/06* (2013.01); *H01L 21/3225* (2013.01); *H01L 29/04* (2013.01); *H01L 29/16* (2013.01); *Y10T 428/24975* (2015.01)

(58) Field of Classification Search
CPC ....... C30B 15/14; C30B 29/06; C30B 31/04; C30B 33/02
See application file for complete search history.

(56) References Cited

U.S. PATENT DOCUMENTS

| | | |
|---|---|---|
| 2001/0055689 A1 | 12/2001 | Park |
| 2004/0025983 A1 | 2/2004 | Morita et al. |

(Continued)

FOREIGN PATENT DOCUMENTS

| | | |
|---|---|---|
| DE | 100 47 345 A1 | 5/2002 |
| EP | 1 887 110 A1 | 2/2008 |

(Continued)

OTHER PUBLICATIONS

Kim et al., "Quantitive Evaluation of Gettering Efficiencies Below 1×1012 Atoms/cm3 in p-Type Silicon Using a 65Cu Tracer", Journal of the Electrochemical Society, 155 (11) H912-H917 (2008).

(Continued)

*Primary Examiner* — Robert M Kunemund
(74) *Attorney, Agent, or Firm* — Brooks Kushman P.C.

(57) ABSTRACT

The invention relates to a semiconductor wafer of monocrystalline silicon, and to a method for producing it. The semiconductor wafer has a zone, DZ, which is free of BMD defects and extends from a front side of the semiconductor wafer into the bulk of the semiconductor wafer, and a region having BMD defects which extends from the DZ further into the bulk of the semiconductor wafer. A silicon single crystal is pulled by the Czochralski method and processed to form a polished monocrystalline silicon substrate wafer. The substrate wafer is treated by rapidly heating and cooling the substrate wafer, slowly heating the rapidly heated and cooled substrate wafer, and keeping the substrate wafer at a specific temperature and over a specific period.

8 Claims, 3 Drawing Sheets

(51) Int. Cl.
*H01L 21/322* (2006.01)
*C30B 15/20* (2006.01)
*C30B 15/04* (2006.01)
*H01L 29/04* (2006.01)
*H01L 29/16* (2006.01)

(56) References Cited

U.S. PATENT DOCUMENTS

| | | |
|---|---|---|
| 2004/0102056 A1 | 5/2004 | Tobe et al. |
| 2007/0252239 A1 | 11/2007 | Maeda et al. |
| 2008/0113171 A1 | 5/2008 | Nakai et al. |
| 2009/0242843 A1* | 10/2009 | Ebara ............................ 252/500 |
| 2010/0059861 A1 | 3/2010 | Mueller et al. |
| 2010/0163807 A1 | 7/2010 | Fukuda et al. |
| 2010/0178753 A1* | 7/2010 | Ono et al. ...................... 438/473 |
| 2011/0053350 A1* | 3/2011 | Watanabe et al. ............ 438/473 |
| 2011/0156215 A1 | 6/2011 | Nakai |

FOREIGN PATENT DOCUMENTS

| | | |
|---|---|---|
| EP | 1 975 990 A1 | 10/2008 |
| JP | 2003-51504 A | 2/2003 |
| JP | 2005-311200 A | 11/2005 |
| JP | 2008-28355 A | 2/2008 |
| JP | 2008-103673 A | 5/2008 |
| JP | 2010-153706 A | 7/2010 |
| JP | 2011-155258 A | 8/2011 |
| TW | 201011132 A1 | 3/2010 |

OTHER PUBLICATIONS

Shabani et al., "Low-Temperature Out-Diffusion of Cu from Silicon Wafer", J. Electrochem. Soc., vol. 143, No. 6, Jun. 1996.

Schmolke et al., "Bulk Micro Defects of P/P Epitaxial Silicon Wafers With Nitrogen Doped Substrates and Their Gettering Behavior", Electrochemical Society Proc. vol. 2002-2, p. 658.

* cited by examiner

SEMICONDUCTOR WAFER COMPOSED OF MONOCRYSTALLINE SILICON AND METHOD FOR PRODUCING IT

CROSS-REFERENCE TO RELATED APPLICATIONS

This application claims priority to German Patent Application No. 10 2012 214085.9 filed Aug. 8, 2012 which is herein incorporated by reference.

BACKGROUND OF THE INVENTION

1. Field of the Invention

The invention relates to a semiconductor wafer composed of monocrystalline silicon, and to a method for producing it. The semiconductor wafer has a denuded zone ("DZ"), which is free of BMD defects and extends from a front side of the semiconductor wafer into the bulk of the semiconductor wafer, and a region having BMD defects which extends from the DZ further into the bulk of the semiconductor wafer.

2. Description of the Related Art

Producing a semiconductor wafer involves firstly slicing a substrate wafer from a single crystal pulled according to the Czochralski method. The Czochralski method comprises melting silicon in a crucible composed of quartz glass, dipping a monocrystalline seed crystal into the melt and continued lifting of the seed crystal away from the surface of the melt. In the course of this movement, the single crystal grows at a phase boundary that has formed between the melt and the lower end of the seed crystal during the process of dipping the seed crystal. The substrate wafer sliced from the single crystal is processed to form a polished monocrystalline substrate wafer composed of silicon and is subsequently subjected to a thermal treatment.

By means of this method, a semiconductor wafer composed of monocrystalline silicon (silicon single crystal wafer) finally becomes accessible which has a DZ extending from the front side into the bulk of the semiconductor wafer, which is free of BMD defects (bulk micro defects). In the DZ, defects such as COP defects (crystal originated particles) having a size of more than 20 nm and a density of not less than $2.5 \times 10^5/cm^3$ and LPit defects (large etch pit defects) cannot be detected either. The term "front side" usually denotes the surface of a semiconductor wafer which is required for constructing electronic devices. The semiconductor wafer furthermore has a region having BMD defects which extends into the bulk of the semiconductor wafer and which adjoins the DZ.

COP defects and LPit defects belong to defects which arise during the production of a silicon single crystal on account of the supersaturation of intrinsic point defects and are therefore also called grown-in defects. Intrinsic point defects are vacancies and silicon interstitials. COP defects are defects which arise as a result of accumulations of vacancies, and LPit defects are defects which arise as a result of accumulations of silicon interstitials.

BMD defects arise if supersaturated oxygen clusters to form oxidic precipitates. They form centers (gettering sites) which can bind, in particular, metallic impurities. It is therefore desirable for there to be a high density of BMD defects in the bulk of the semiconductor wafer, which permanently keeps such impurities away from the DZ. The presence of free vacancies promotes the formation of nuclei which can give rise to BMD defects.

EP 1 975 990 A1 describes a method by which a semiconductor wafer composed of mono crystalline silicon can be produced, which wafer has a DZ and a region outside the DZ in which the average density of BMD defects is, for example $7 \times 10^9/cm^3$. In order to ensure that no grown-in defects are present, in accordance with the teaching of the cited document, during the production of the silicon single crystal, consideration is given to ensuring that the single crystal has an N region extending from the center as far as the circumference of the single crystal.

The "N" region is the designation of a region in the single crystal where the concentrations of vacancies and silicon interstitials are virtually balanced, such that COP defects having a size of more than 20 nm and LPit defects cannot be detected there. The detection of COP defects having a size of more than 20 nm is accomplished, for example, by the scattering of IR laser light at COP defects and the detection of the scattered light (IR laser tomography). One suitable measuring device, which was also used in the examples described here, is the MO-441 from Mitsui, Japan. The IR laser tomography carried out therewith along a fracture edge of the substrate wafer is designated hereinafter as an "MO-441" measurement.

Furthermore, the N region is also free of OSF defects (oxidation induced stacking faults). OSF defects represent dislocation loops. They arise if silicon interstitials are produced on account of oxidation and nucleate at nuclei of oxygen precipitates. An N region in which the number of silicon interstitials exceeds the number of vacancies is called an "Ni region," and an N region in which this concentration ratio of intrinsic point defects is exactly the opposite is called an "Nv region."

The ratio V/G of the pulling rate V and the temperature gradient G orthogonally with respect to the phase boundary of the growing single crystal determines as a key parameter whether and to what extent one of the stated types of intrinsic point defects is present to excess in the lattice of the grown single crystal. By control of V/G, therefore, it is possible to produce silicon single crystals which, for example, have over their axial length completely or partly regions in which the N region extends from the center as far as the circumference of the single crystal, or regions which are characterized by a region having COP defects which extends outward from the center and by an adjoining N region extending as far as the circumference of the single crystal.

What can furthermore be achieved by means of the control of the radial profile of V/G is that the N region is completely an Nv region or completely an Ni region or a sequence of radially adjoining Nv and Ni regions.

A semiconductor wafer which is sliced from such a single crystal and processed to form a polished substrate wafer accordingly has from its center as far as its edge an N region or a region having COP defects which extends outward from the center of the substrate wafer, and an adjoining N region extending as far as the edge of the substrate wafer. However, such a substrate wafer still has no DZ and no adjacent region having BMD defects in the bulk of the substrate wafer.

A method also described in EP 1 975 990 A1 uses an RTP (rapid thermal processing) thermal treatment of the substrate wafer for producing the DZ. In this case, the substrate wafer is heated to a temperature of around 1180° C. in a short time, left in this temperature range for a short time and cooled in a short time. The RTP thermal treatment takes place in a gas atmosphere which injects vacancies into the substrate wafer. These vacancies can be eliminated either by recombination with silicon interstitials or by diffusion to the surface of the substrate wafer. The latter possibility can only occur, however, if the diffusion length suffices to reach the surface. One consequence of this mechanism is that an axially inhomogeneous concentration profile of vacancies is present after the thermal treatment, with a depletion of vacancies in a region which adjoins the front side and the rear side of the substrate wafer, if the rear side was also exposed to the vacancy-injecting atmosphere.

The region depleted of vacancies forms the DZ (denuded zone). In the region adjoining it, injected vacancies together with oxygen form complexes which can be nucleated by subsequent thermal treatments and developed into BMD defects.

In accordance with the method described in EP 1 975 990 A1, the substrate wafer is subjected to a post-RTP thermal treatment at a temperature in the range of 800-1000° C. over a period of not more than two hours. The detection of the developed BMD defects comprises a further thermal treatment at a temperature of 900° C. with a treatment duration of 10 hours.

EP 1 887 110 A1 describes the production of a semiconductor wafer composed of monocrystalline silicon from a single crystal which is doped with nitrogen and is pulled in an atmosphere containing hydrogen. The presence of nitrogen in the semiconductor wafer also promotes the formation of nuclei from which BMD defects can arise. Pulling the single crystal in an atmosphere containing hydrogen simplifies the control of the quotient V/G. The range is extended within which the quotient must remain in order that there arises in the single crystal an N region which extends from the center as far as the circumference of the single crystal.

The so-called getter efficiency ("GE") indicates how effectively BMD defects in the bulk of a semiconductor wafer can keep metallic impurities away from the surface of the semiconductor wafer. If a specific quantity of a metallic impurity such as copper is diffused into the bulk of the semiconductor wafer via the rear side and the quantity of the impurity that can be detected on the front side of the semiconductor wafer is measured, the getter efficiency can be calculated in accordance with the following formula:

$$GE=(1-C/Ct)\times 100\%,$$

where Ct is the quantity diffused into the bulk via the rear side of the semiconductor wafer and C is the quantity of the impurity that is detected on the front side of the semiconductor wafer.

In order to drive the impurity into the bulk of the semiconductor wafer, the semiconductor wafer is usually heated. Kim et al. (Journal of the Electrochemical Society, 155 (11) H912-H917 (2008)) have shown that this drive-in step can take place under specific conditions also at room temperature. In order to drive the impurity out of the bulk of the semiconductor wafer to the front side of the semiconductor wafer, a thermal treatment of the semiconductor wafer can be effected. Such a drive-out thermal treatment that promotes the diffusion of the impurity to the front side of the semiconductor wafer is called low-temperature outdiffusion (LTOD) by Kim et al.

Shabani et al. (J. Electrochem. Soc., Vol. 143, No. 6, June 1996) have shown that copper can outdiffuse from the bulk of a p-doped semiconductor wafer composed of silicon virtually completely to the surface of the semiconductor wafer in a period of a few days even at room temperature if there are not enough BMD defects having a gettering effect in the bulk of the semiconductor wafer.

SUMMARY OF THE INVENTION

An object of the invention is to ensure that a high getter efficiency of a semiconductor wafer composed of silicon is maintained even after a relatively long storage time of the semiconductor wafer. Specifically, it has now been discovered that certain conditions have to be fulfilled in order to achieve this object, and that it does not suffice to restrict the process for producing a semiconductor wafer to one comprising a DZ and an adjoining region having BMD defects.

These and other objects are thus achieved by means of a method for producing a semiconductor wafer composed of monocrystalline silicon having a zone, DZ, which is free of BMD defects, and having a region having BMD defects which adjoins the DZ, comprising:

pulling a silicon single crystal in accordance with the Czochralski method;

processing the single crystal to form a polished monocrystalline substrate wafer composed of silicon which, from the center as far as the edge, consists of an N region or has COP defects, the size of which is more than 20 nm and the average density of which is less than $2.5\times10^5/cm^3$, and which has a nitrogen concentration of not more than $1\times10^{12}$ atoms/$cm^3$ and an oxygen concentration of not less than $5.2\times10^{17}$ atoms/$cm^3$ and not more than $6.0\times10^{17}$ atoms/$cm^3$;

rapidly heating and cooling the substrate wafer in an atmosphere which substantially consists of $NH_3$ and argon in a volume ratio of not less than 1:25 and not more than 1:5 to a temperature of not less than 1165° C. and not more than 1180° C. and with a heating rate and a cooling rate of not less than 30 K/s and not more than 50 K/s;

slowly heating the rapidly heated and cooled substrate wafer from a temperature of not less than 500° C. and not more than 550° C. to a temperature of not less than 930° C. and not more than 1000° C. with a heating rate of not less than 0.5 K/min and not more than 1.5 K/min; and keeping the substrate wafer at the temperature of not less than 930° C. and not more than 1000° C. over a period of not less than 7 hours and not more than 10 hours.

The object is also achieved by means of the product of the method, namely a semiconductor wafer composed of monocrystalline silicon, when subjected to defect delineation/optical microscopy comprising:

a zone, DZ, which extends from a front side of the semiconductor wafer right into the bulk of the semiconductor wafer and which is free of BMD defects and has an averaged thickness of not less than 5 μm, and a region which adjoins the DZ and extends further into the bulk of the semiconductor wafer and BMD defects having a size of not less than 50 nm, wherein a depth profile of the BMD defects in said region has a local maximum which is at a distance of not less than 20 μm and not more than 200 μm from the front side of the semiconductor wafer, and wherein the density of the BMD defects at the local maximum is not less than $2\times10^{10}/cm^3$.

BRIEF DESCRIPTION OF THE DRAWINGS

FIG. 2: BMD density (BMD-D) vs. depth (d) with respect to the front side of the semiconductor wafer after defect delineation/optical microscopy: Substrate wafer having a concentration of interstitial oxygen [Oi] of $5.9\times10^{17}/cm^3$;

first thermal treatment: RTA, Ar/NH$_3$, 20:1, at 1175° C. with 20 s holding time; second thermal treatment: 500-950° C. with 1K/min ramp and holding time of 6 hours; additional thermal treatment in the context of defect delineation/optical microscopy: 1000° C. for 16 hours.

DETAILED DESCRIPTION OF THE PREFERRED EMBODIMENT(S)

Figure 1:
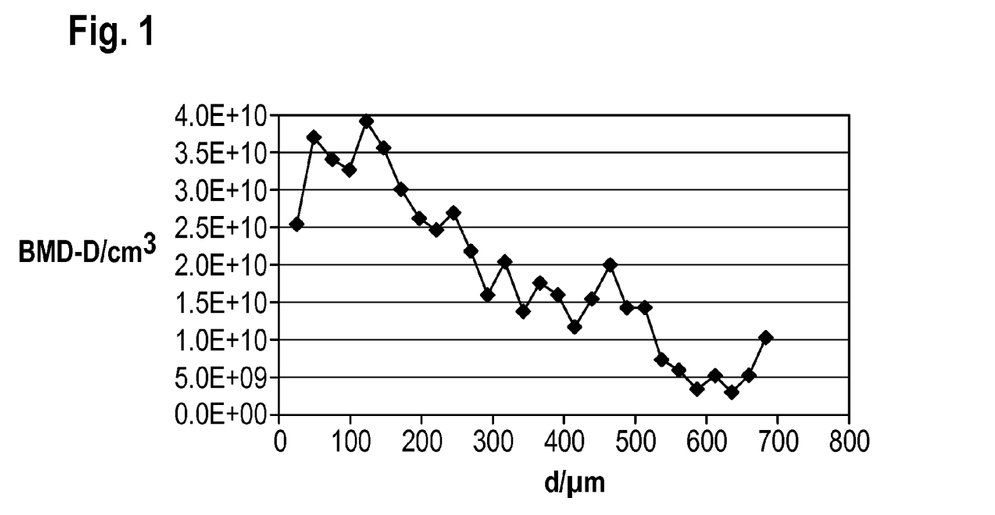
FIG. 1: BMD density (BMD-D) vs. depth (d) with respect to the front side of the semiconductor wafer after defect delineation/optical microscopy: Substrate wafer having a concentration of interstitial oxygen [Oi] of $5.4\times10^{17}/cm^3$; first thermal treatment: RTA, Ar/$NH_3$, 20:1, at 1175° C. with 20 s holding time; second thermal treatment: 500-950° C. with 1K/min ramp and holding time of 8 hours; additional thermal treatment in the context of defect delineation/optical microscopy: 1000° C. for 16 hours.
Figure 2:
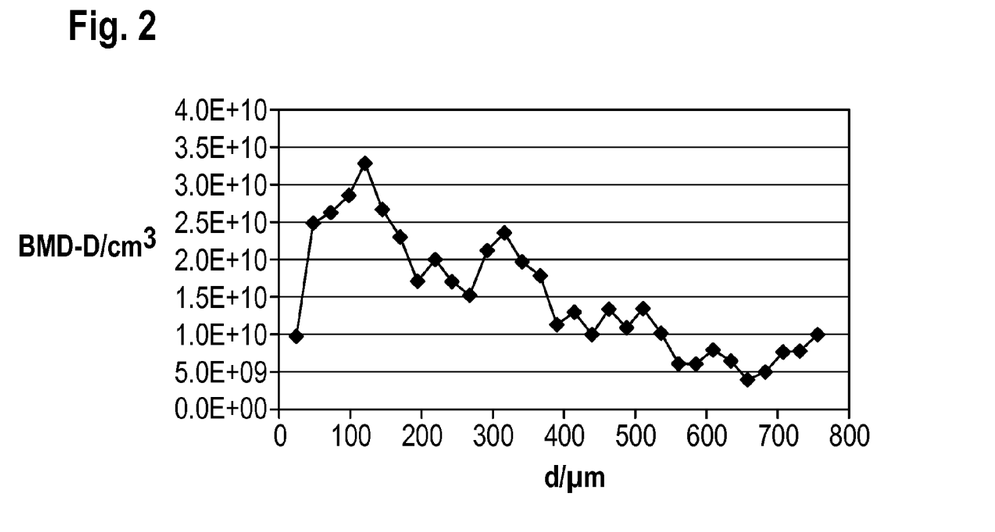
Figure 3:
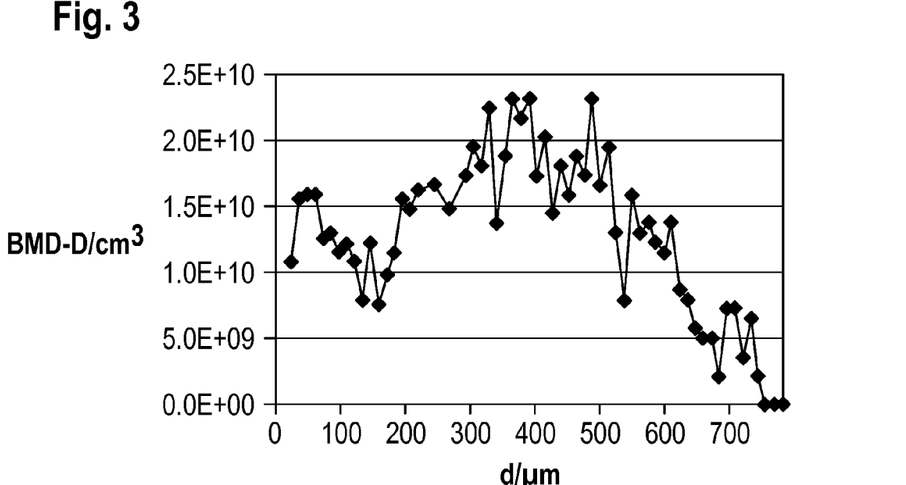
FIG. 3: BMD density (BMD-D) vs. depth (d) with respect to the front side of the semiconductor wafer after defect delineation/optical microscopy: Substrate wafer having a concentration of interstitial oxygen [Oi] of 5.3×10$^{17}$/cm$^3$ and a concentration of nitrogen of 8×10$^{13}$/cm$^3$; partial pressure of hydrogen during the pulling of the single crystal: 15.5 Pa (0.155 mbar); first thermal treatment: RTA, Ar/NH$_3$, 20:1, at 1175° C. with 20 s holding time; second thermal treatment: 500-950° C. with 1K/min ramp and holding time of 6 hours; additional thermal treatment in the context of defect delineation/optical microscopy: 1000° C. for 16 hours.
Figure 4:
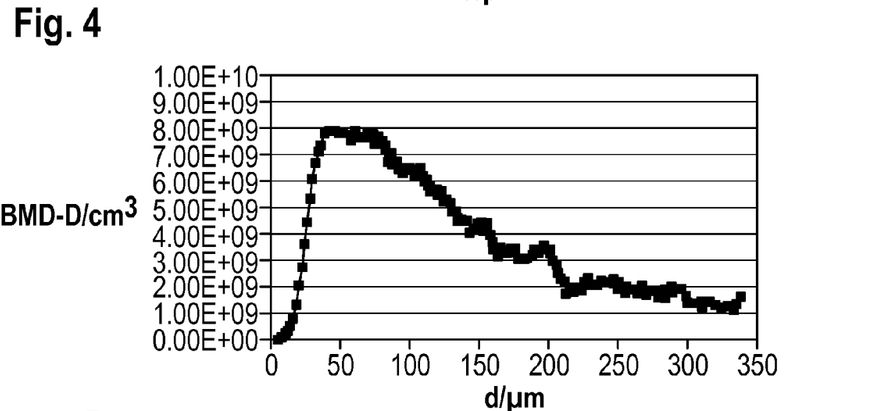
FIG. 4: BMD density (BMD-D) vs. depth (d) with respect to the front side of the semiconductor wafer measured with MO-411: Substrate wafer having a concentration of interstitial oxygen [Oi] of 5.4×10$^{17}$/cm$^3$; first thermal treatment: RTA, Ar/NH$_3$, 20:1, at 1175° C. with 20 s holding time; second thermal treatment: 500-950° C. with 1K/min ramp and holding time of 10 hours.
Figure 5:
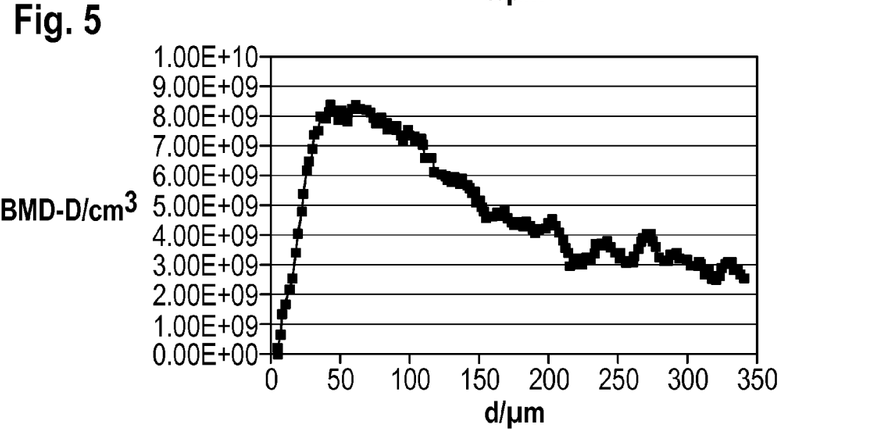
FIG. 5: BMD density (BMD-D) vs. depth (d) with respect to the front side of the semiconductor wafer measured with MO-411: Substrate wafer having a concentration of interstitial oxygen [Oi] of 5.9×10$^{17}$/cm$^3$; first thermal treatment: RTA, Ar/NH$_3$, 20:1, at 1175° C. with 20 s holding time; second thermal treatment: 500-950° C. with 1K/min ramp and holding time of 10 hours.
Figure 6:
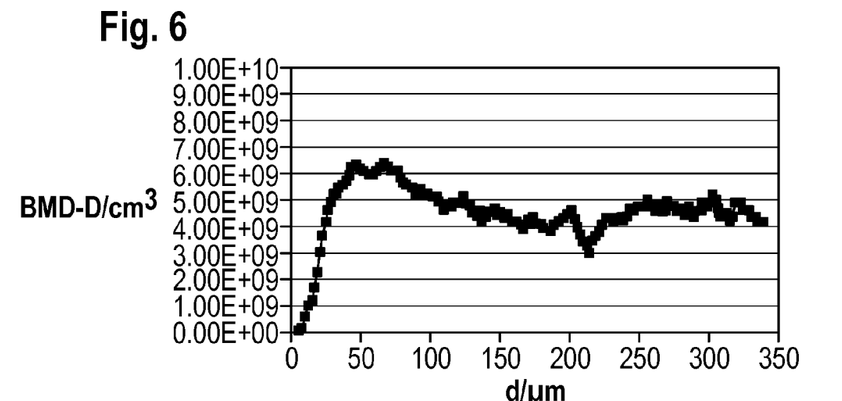
FIG. 6: BMD density (BMD-D) vs. depth (d) with respect to the front side of the semiconductor wafer measured with MO-411: Substrate wafer having a concentration of interstitial oxygen [Oi] of 5.3×10$^{17}$/cm$^3$ and a concentration of nitrogen of 8×10$^{13}$/cm$^3$; partial pressure of hydrogen during the pulling of the single crystal: 15.5 Pa (0.155 mbar); first thermal treatment: RTA, Ar/NH$_3$, 20:1, at 1175° C. with 20 s holding time; second thermal treatment: 500-950° C. with 1K/min ramp and holding time of 6 hours.
Figure 7:
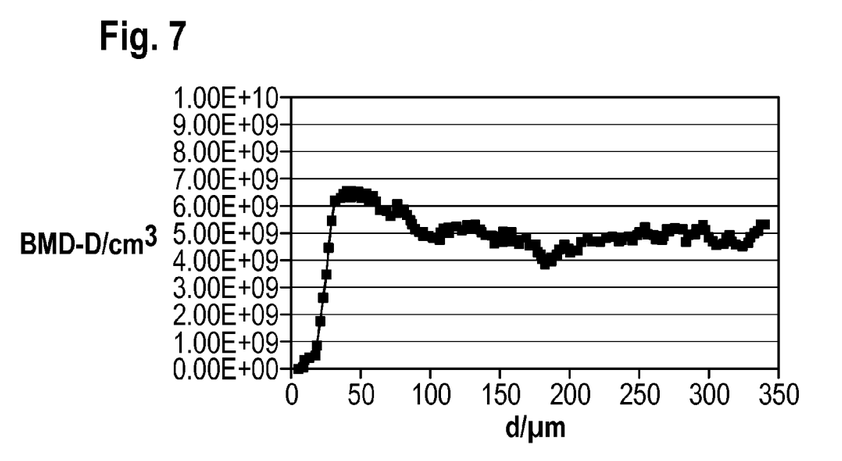
FIG. 7: BMD density (BMD-D) vs. depth (d) with respect to the front side of the semiconductor wafer measured with MO-411: Substrate wafer having a concentration of interstitial oxygen [Oi] of 5.3×10$^{17}$/cm$^3$ and a concentration of nitrogen of 8×10$^{13}$/cm$^3$; partial pressure of hydrogen during the pulling of the single crystal: 15.5 Pa (0.155 mbar); first thermal treatment: RTA, Ar/NH$_3$, 20:1, at 1175° C. with 20 s holding time; second thermal treatment: 500-950° C. with 1K/min ramp and holding time of 8 hours.
Figure 8:
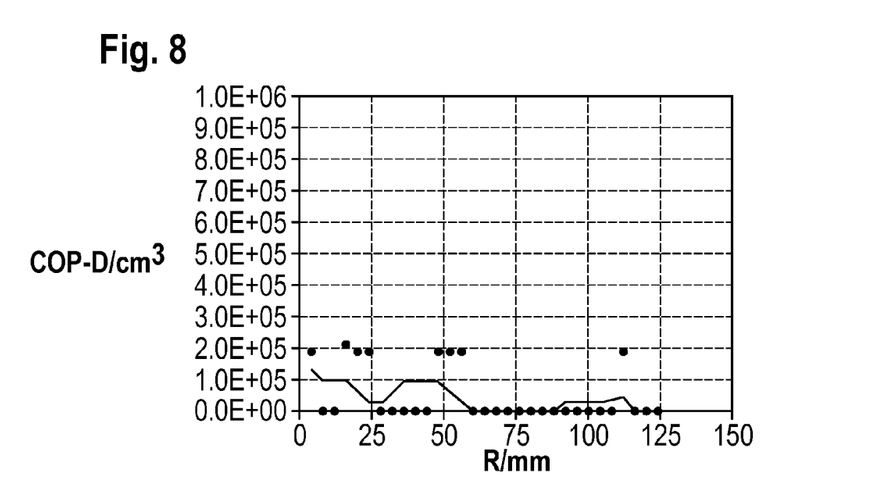
FIG. 8: COP densities (COP-D) vs. radius (R) of a substrate wafer measured with MO-441 with device setting 1000 mW for measuring COP defects having a size of more than 20 nm. The averaged COP density is 5×10$^4$/cm$^3$. The solid line shows the moving average over 5 data points (calculated starting from pos. 150 mm radius).

The method according to the invention preferably comprises, over and above the two thermal treatments mentioned, no additional thermal treatments of the substrate wafer that subject the substrate wafer to temperatures of more than 1000° C.

The average density of the COP defects denotes a density of COP defects averaged over the radius of the substrate wafer.

The averaged thickness of the DZ of the semiconductor wafer corresponds to a thickness of the DZ averaged over the radius of the semiconductor wafer.

The density of the BMD defects can likewise be determined with the aid of an MO-441 measuring device along a fracture edge of the semiconductor wafer. As an alternative thereto, the fracture edge can be etched by means of a Secco or Wright etch and the etched-free BMD defects can be counted under an optical microscope.

In contrast to the measurement with the aid of MO-441, the semiconductor wafer has to be subjected to an additional thermal treatment over a period of 16 hours at 1000° C., which is carried out before the etching and is a growth step for BMD defects. The additional thermal treatment is not a step for producing the semiconductor wafer according to the invention, but rather a step for detecting specific properties of the depth profile of the BMD density. The alternative measurement of the BMD density described, consisting of the additional thermal treatment, the etch of the fracture edge and assessment under an optical microscope, is designated here as defect delineation/optical microscopy.

Measured with MO-441, the density of the BMD defects at the local maximum is not less than 6×10$^9$/cm$^3$.

The semiconductor wafer composed of silicon exhibits a getter efficiency of not less than 90% not only directly after production, but also after a relatively long storage time. Accordingly, the getter capability of the semiconductor wafer is maintained permanently, to be precise, even when the semiconductor wafer is subjected to temperatures that promote the outdiffusion of impurities to the surface of the semiconductor wafer. A semiconductor wafer produced according to the invention requires no further thermal treatments for optimizing the size and/or the density of BMD defects. It is preferably processed further in order to produce electronic devices, wherein thermal treatments in the course of this further processing are most preferably without exception LTB processes (low thermal budget). The latter are taken to mean thermal treatments of the semiconductor wafer which take place at temperatures of not more than 1000° C.

The method comprises producing a silicon single crystal according to the Czochralski method, wherein various conditions with regard to the formation of intrinsic point defects and with regard to the uptake of nitrogen and oxygen into the single crystal have to be fulfilled.

Pulling of the single crystal is carried out with control of the ratio V/G of the pulling rate V and the temperature gradient G orthogonally with respect to the phase boundary of the growing single crystal in such a way that at least one region arises which is free of LPit defects and in which an N region extends from the center as far as the circumference of the single crystal, or at least one region arises in which the density of COP defects having a size of more than 20 nm, said density being averaged from the center as far as the circumference, is less than 2.5×10$^5$/cm$^3$.

The region has an axial length which corresponds to the length of the section of the single crystal which has the nominal diameter of the single crystal, or a fraction of this length. The nominal diameter is preferably not less than 300 mm, particularly preferably 450 mm.

By refraining from intentionally doping the melt with nitrogen, this furthermore controls the fact that the region of the single crystal having the point defect distribution mentioned has a nitrogen concentration of not more than 1×10$^{12}$ atoms/cm$^3$.

The method furthermore involves controlling the region of the single crystal having the point defect distribution mentioned to have a concentration of interstitial oxygen of not less than $5.2 \times 10^{17}$ atoms/cm$^3$ and not more than $6.0 \times 10^{17}$ atoms/cm$^3$ (ASTM F 121, 1983). Process parameters for setting the oxygen concentration are, for example, the rotational speed of the crucible and of the seed crystal, pressure and flow rate of the inert gas conducted through the pulling chamber, and type and strength of a magnetic field impressed on the melt.

The region of the single crystal having the required properties with regard to the point defect distribution and the concentrations of nitrogen and oxygen is processed to form polished substrate wafers composed of monocrystalline silicon.

Such a substrate wafer has a polished front side and a rear side, which can likewise be polished. The substrate wafer has the point defect distribution predefined by the single crystal. It is free of LPit defects and, from the center as far as the edge, consists of N region or of a region in which the average density of COP defects having a size of more than 20 nm, from the center as far as the edge of the substrate wafer, is less than $2.5 \times 10^5$/cm$^3$. In the same way as a substrate wafer which has N region from the center as far as the edge, preference is also given to a substrate wafer which has a region having COP defects having a size of more than 20 nm which extends outward from the center of the substrate wafer and is adjoined by an N region which extends as far as the edge of the substrate wafer, provided that the density of the COP defects averaged from the center as far as the edge of the substrate wafer is less than $2.5 \times 10^5$/cm$^3$. This region having COP defects (COP disk) preferably has a radius of not more than 30% of the radius of the substrate wafer.

The N region preferably comprises at least one Nv region and at least one Ni region, for example an Nv region and an adjoining Ni region or an Nv region, an adjoining Ni region and a further Nv region adjoining the latter.

The nitrogen concentration in the substrate wafer is not more than $1 \times 10^{12}$ atoms/cm$^3$, which can be achieved by dispensing with the doping with nitrogen during the production of the single crystal. Dispensing with this doping has the advantage that BMD nucleation induced by nitrogen does not occur and associated difficulties are avoided. Doping with nitrogen could have the effect that a DZ having a sufficient depth cannot arise on account of the formation of BMD defects.

The polished substrate wafer composed of monocrystalline silicon is subjected to an RTP thermal treatment in an atmosphere that injects vacancies into the substrate wafer. The RTP thermal treatment is a first thermal treatment and produces a DZ which extends on average not less than 5 µm into the bulk of the substrate wafer and is therefore sufficiently thick. The RTP thermal treatment also produces a region which adjoins the DZ and which extends further into the bulk of the substrate wafer and in which a high density of BMD nuclei is present. The BMD nuclei are subsequently developed into BMD defects by means of a further, second thermal treatment of the substrate wafer, the BMD defects imparting the required getter capability to the semiconductor wafer.

The depth profile of the BMD density in the region adjoining the DZ, after defect delineation/optical microscopy, comprises a local maximum having a density of BMD defects of not less than $2 \times 10^{10}$/cm$^3$. The local maximum is preferably at a distance of not less than 20 µm and not more than 200 µm from the front side of the semiconductor wafer in the bulk of the semiconductor wafer. The developed BMD defects have a size of not less than 50 nm and preferably of not less than 75 nm.

The RTP thermal treatment has to be carried out under specific conditions. It has to take place in an atmosphere which substantially consists of NH$_3$ and argon. The volume ratio of NH$_3$/argon is not less than 1:25 and not more than 1:5. With a smaller ratio, the number of vacancies injected into the substrate wafer and the number of BMD nuclei thereupon forming are insufficient. If the ratio is greater, the region having BMD nuclei extends close to the front side of the substrate wafer, and the DZ is not sufficiently thick.

The substrate wafer is heated in a short time to a temperature in the range of not less than 1165° C. and not more than 1180° C., left in this temperature range for a short time and cooled in a short time. The residence duration in this temperature range is preferably 10 to 25 s. If the temperature is lower than the lower limit value, the number of vacancies injected into the substrate wafer and the number of BMD nuclei thereupon forming are insufficient. If the temperature is higher than the upper limit value, the region having BMD nuclei extends close to the front side of the substrate wafer, and the DZ is not sufficiently thick.

The rapid heating and cooling of the substrate wafer preferably takes place with identical heating and cooling rates. The rate (ramp rate) during heating and the rate during cooling are not less than 30 K/s and not more than 50 K/s. A heating rate that is lower than the specified lower limit has the effect that the density and size of the BMD defects after complete development of the BMD defects in the region adjoining the DZ does not suffice to obtain the required getter effect. A cooling rate that is greater than the specified upper limit has the effect that the DZ does not become sufficiently thick because the region having BMD nuclei extends close to the front side of the substrate wafer.

For the complete development of the BMD nuclei into BMD defects, after the RTP thermal treatment a further, second thermal treatment (post-RTP, post-RTP anneal) of the substrate wafer is carried out. For this purpose, the substrate wafer is brought from a specific starting temperature to a specific target temperature at a specific heating rate and is cooled again after a specific time. The conditions of the further thermal treatment likewise have to be chosen carefully.

The starting temperature is the temperature in the furnace in which the further thermal treatment is carried out, to be precise when the furnace is charged with the substrate wafer. The starting temperature is not less than 500° C. and not more than 550° C. If the starting temperature is below the lower limit value, the method is not very economical. If the starting temperature is above the upper limit value, the result is that the density and size of the BMD defects after complete development of the BMD defects in the region adjoining the DZ do not suffice to obtain the required getter effect. The BMD defects are then in particular smaller than 50 nm, which makes them less effective as getter centers.

The heating rate is not less than 0.5 K/min and not more than 1.5 K/min. If the heating rate is lower than the lower limit value, the method is less economical. If the heating rate is greater than the upper limit value, the result is that the density and size of the BMD defects after complete development of the BMD defects in the region adjoining the DZ do not suffice to obtain the required getter effect. The BMD defects are then in particular smaller than 50 nm, which makes them less effective as getter centers.

The target temperature is in the range of not less than 930° C. and not more than 1000° C. If the target temperature is below the lower limit value, the result is that the density and size of the BMD defects after complete development of the BMD defects in the region adjoining the DZ do not suffice to obtain the required getter effect. The BMD defects are then in particular smaller than 50 nm, which makes them less effective as getter centers. In this case, the temperature and the oxygen concentration in the substrate wafer do not suffice to develop the BMD defects in the desired way. If the target temperature is above the upper limit value, BMD nuclei are decomposed. As a result, likewise, the density and size of the BMD defects after complete development of the BMD defects in the region adjoining the DZ do not suffice to obtain the required getter effect. The BMD defects are then in particular smaller than 50 nm, which makes them less effective as getter centers.

The duration of the further thermal treatment of the substrate wafer at a target temperature in the temperature range of not less than 930° C. and not more than 1000° C. is not less than 7 hours and not more 10 hours. If the period is shorter than the lower limit value, the density and size of the BMD defects after complete development of the BMD defects in the region adjoining the DZ do not suffice to obtain the required getter effect. The BMD defects are then in particular smaller than 50 nm, which makes them less effective as getter centers. If the period is longer than the upper limit value, the method is not very economical.

Owing to the thermal treatments and the consequences thereof, the concentrations of nitrogen and oxygen are lower in the semiconductor wafer than in the substrate wafer.

The previously described method makes no use of advantages which arise from the single crystal being doped with nitrogen and pulled in an atmosphere containing hydrogen. Moreover, it is not optimized for the thermal treatment of substrate wafers containing interstitial oxygen whose concentration is comparatively low. An alternative method, which likewise achieves the abovementioned object of the invention and is better suited to such substrate wafers, comprises pulling the single crystal in an atmosphere containing hydrogen and doping the single crystal with nitrogen. The alternative method also requires a procedure during the further thermal treatment of the substrate wafer which deviates from that already described.

The object is thus also achieved by means of a method for producing a semiconductor wafer composed of monocrystalline silicon having a zone, DZ, which is free of BMD defects, and having a region having BMD defects which adjoins the DZ, comprising:

pulling a silicon single crystal in accordance with the Czochralski method, wherein the growing single crystal is doped with nitrogen and pulled in an atmosphere containing hydrogen;

processing the single crystal to form a polished monocrystalline substrate wafer composed of silicon which, from the center as far as the edge, consists of an N region or of a region in which the average density of COP defects, the size of which is more than 20 nm, is less than $2.5 \times 10^5/cm^3$ from the center as far as the edge of the substrate wafer, and which has a nitrogen concentration of not less than $3 \times 10^{13}$ atoms/cm$^3$ and not more than $3 \times 10^{14}$ atoms/cm$^3$ and an oxygen concentration of not less than $5.0 \times 10^{17}$ atoms/cm$^3$ and not more than $5.8 \times 10^{17}$ atoms/cm$^3$;

rapidly heating and cooling the substrate wafer in an atmosphere which substantially consists of NH$_3$ and argon in a volume ratio of not less than 1:25 and not more than 1:5 to a temperature of not less than 1165° C. and not more than 1180° C. and with a heating rate and a cooling rate of not less than 30 K/s and not more than 50 K/s;

slowly heating the rapidly heated and cooled substrate wafer from a temperature of not less than 500° C. and not more than 550° C. to a temperature of not less than 900° C. and not more than 1000° C. with a heating rate of not less than 3 K/min and not more than 7 K/min; and keeping the substrate wafer at the temperature of not less than 900° C. and not more than 1000° C. over a period of not less than 5 hours and not more than 8 hours.

The alternative method utilizes the advantage of the extended range available for controlling the quotient V/G if the single crystal is pulled in an atmosphere containing hydrogen. It also utilizes the effect of nitrogen as a promoter of the formation of BMD nuclei, such that a higher number of BMD defects can be developed. On account of their higher number, the BMD defects can also be smaller, without the getter effect being reduced on account of this. However, the alternative method also avoids the production of nitrogen-induced defects that prevent the formation of the required DZ.

The hydrogen partial pressure during the pulling of the single crystal is preferably not less than 10 Pa and not more than 80 Pa.

The pulling of the single crystal is carried out with control of the fact that the region of the single crystal having the stated distribution of intrinsic point defects has a concentration of interstitial oxygen of not less than $5.0 \times 10^{17}$ atoms/cm$^3$ and not more than $5.8 \times 10^{17}$ atoms/cm$^3$ (ASTM F 121, 1983).

The growing single crystal is doped with nitrogen by a nitrogen-containing compound being dissolved in the melt. By way of example, a silicon semiconductor wafer coated with silicon nitride is melted together with polycrystalline silicon in the crucible.

The concentration of nitrogen in the substrate wafer is not less than $3 \times 10^{13}$ atoms/cm$^3$ and not more $3 \times 10^{14}$ atoms/cm$^3$. If the concentration of nitrogen is lower than the specified lower limit, a sufficient number of BMD nuclei cannot be formed owing to the low oxygen concentration. If the concentration of nitrogen is higher than the specified upper limit, it is difficult to obtain a DZ having a sufficient depth, despite the comparatively low oxygen concentration.

The substrate wafer has a polished front side and a rear side, which can likewise be polished. The substrate wafer has the point defect distribution predefined by the single crystal. It is free of LPit defects and, from the center as far as the edge, consists of N region or of a region in which the average density of COP defects having a size of more than 20 nm, from the center as far as the edge of the substrate wafer, is less than $2.5 \times 10^5/cm^3$. In the same way as a substrate wafer which has N region from the center as far as the edge, preference is also given to a substrate wafer which has a region having COP defects having a size of more than 20 nm which extends outward from the center of the substrate wafer and is adjoined by an N region which extends as far as the edge of the substrate wafer, provided that the density of the COP defects averaged from the center as far as the edge of the substrate wafer is less than $2.5 \times 10^5/cm^3$. This region having COP defects (COP disk) preferably has a radius of not more than 30% of the radius of the substrate wafer.

The N region preferably comprises at least one Nv region and at least one Ni region, for example an Nv region and an adjoining Ni region or an Nv region, an adjoining Ni region and a further Nv region adjoining the latter.

With regard to carrying out the RTP thermal treatment of the substrate wafer, the alternative method does not differ from the method already described. With regard to the further thermal treatment (post-RTP thermal treatment) of the substrate wafer, there are differences which make the alternative method more economical.

The heating rate is not less than 3 K/min and not more than 7 K/min. If the heating rate is lower than the lower limit value, the method is less economical. If the heating rate is greater than the upper limit value, the density and size of the BMD defects after complete development of the BMD defects in the region adjoining the DZ do not suffice to obtain the required getter effect. The BMD defects are then in particular smaller than 25 nm, which makes them less effective as getter centers.

The duration of the further thermal treatment of the substrate wafer in the temperature range of not less than 900° C. and not more than 1000° C. is not less than 5 hours and not more than 8 hours. If the period is shorter than the lower limit value, the density and size of the BMD defects after complete development of the BMD defects in the region adjoining the DZ do not suffice to obtain the required getter effect. If the period is longer than the upper limit value, the method is less economic.

The object of the invention is also achieved by means of the product of the alternative method. The invention therefore also relates to a semiconductor wafer composed of monocrystalline silicon, which is doped with nitrogen and hydrogen, and when subjected to defect delineation/optical microscopy comprises:

a DZ which extends from a front side of the semiconductor wafer right into the bulk of the semiconductor wafer and which is free of BMD defects and has an averaged thickness of not less than 5 µm, and a region which adjoins the DZ and extends further into the bulk of the semiconductor wafer having BMD defects having a size of not less than 25 nm, wherein a depth profile of the BMD defects in said region has a first local maximum, which is at a distance of not less than 20 µm and not more than 100 µm from the front side of the semiconductor wafer, and wherein the density of the BMD defects at the first local maximum is not less than $1.0 \times 10^{10}/cm^3$, and the depth profile of the BMD defects has a second local maximum, which is at a distance of not less than 300 µm and not more than 500 µm from the front side of the semiconductor wafer, and wherein the density of the BMD defects at the second local maximum is not less than $2 \times 10^{10}/cm^3$.

On account of decreasing detection sensitivity with increasing measurement depth and the lack of an additional thermal treatment, an MO-441 measurement, in contrast to the measurement by means of defect delineation/optical microscopy, indicates a lower or no second local maximum of the BMD density.

Measured with MO-441, the density of the BMD defects at the first local maximum is not less than $6 \times 10^9/cm^3$ and, at a distance of not less than 300 µm and not more than 500 µm from the front side of the semiconductor wafer, an averaged BMD density is not less than $3 \times 10^9/cm^3$.

Although the BMD defects in the bulk of the semiconductor wafer produced by the alternative method are smaller, they are present in a greater number in deeper regions (starting from approximately 50 µm from the front side of the semiconductor wafer), which is sufficient for the required getter effect. The BMD defects have a size of not less than 25 nm and preferably not more than 100 nm. A depth profile of the region having BMD defects which adjoins the DZ has a first and a second local maximum after defect delineation/optical microscopy. The density of the BMD defects is not less than $1.0 \times 10^{10}/cm^3$ at the first local maximum and not less than $2 \times 10^{10}/cm^3$ at the second local maximum. The first local maximum is at a distance from the front side of the semiconductor wafer of not less than 20 µm and not more than 100 µm, and the second local maximum is at a distance from the front side of the semiconductor wafer of not less than 300 and not more than 500 µm.

Irrespective of whether or not the alternative method is employed, a silicon semiconductor wafer produced according to the invention exhibits a getter efficiency of not less than 95% not only directly after production but also after a relatively long storage time. The getter efficiency is not less than 95% directly after the production of the semiconductor wafer.

EXAMPLES/COMPARATIVE EXAMPLES

Silicon semiconductor wafers were produced in a manner according to the invention and in a manner deviating therefrom, and characterized and checked with regard to their getter capability.

Single crystals were pulled and processed to form polished substrate wafers composed of monocrystalline silicon, which had N region from the center as far as the edge or a region having COP defects having a size of more than 20 nm and an average density of less than $2.5 \times 10^5/cm^3$.

One portion of the substrate wafers originated from single crystals doped with nitrogen and hydrogen. The other portion had not been doped with hydrogen and nitrogen. All the substrate wafers were first subjected to an RTP thermal treatment in accordance with the requirements of the present invention.

Afterward, the substrate wafers were separated into those which were subjected to a further thermal treatment in accordance with the requirements of the invention (examples) and those which were subjected to a further thermal treatment deviating therefrom (comparative examples).

The semiconductor wafers produced in this way were characterized and tested with regard to their getter capability. For this purpose, the semiconductor wafers were divided into square samples.

Calculating the BMD Size:

The BMD size was calculated using a simulation model described by Schmolke et al., (Electrochemical Society Proc. Vol. 2002-2, page 658). The calculation was effected using the following parameters:

surface energy (sigma=0) and precipitate volume per precipitated oxygen atom=$3.45 \times 10^{23}$ $cm^3$.

Measuring the BMD size: A portion of the samples was additionally measured with regard to their size by means of MO-441. The detection settings for this purpose were: laser power 100 mW, measurement time per data point=1 ms, intensity filter settings of both filters (50 and respectively 100%).

Determining the depth profile of the BMD defects by means of defect delineation/optical microscopy:

The respective sample was subjected to thermal treatment for 16 hours at 1000° C. under nitrogen and subsequently broken into two parts. Afterward, the fracture area was etched and the density of the BMD defects depending on the distance from the front side of the semiconductor wafer was determined with the aid of an optical microscope.

Determining the Thickness of the DZ:

The respective sample was subjected to thermal treatment for 16 hours at 1000° C. under nitrogen and subsequently broken into two parts. Afterward, the fracture area was etched and the depth of the first BMD defect on a measurement path having a length of 5 mm along the fracture edge was measured with the aid of an optical microscope. Afterward, the depth of a further 7 BMD defects on the measurement path was determined and the average value of the 8 depth measurements performed was calculated and specified as the average thickness of the denuded zone.

Determining the Getter Efficiency:

a) Contaminating the Sample with Copper:

The respective sample was dipped into an aqueous solution of hydrogen fluoride (50% by weight HF) for ten minutes and subsequently contaminated with copper ions on the rear side. For this purpose, the rear side of the sample was brought into contact with an aqueous solution containing $Cu(NO_3)_2$ at room temperature over a period of 5 minutes, as a result of which the rear side was contaminated with $1 \times 10^{13}$ cm$^{-2}$ of copper ions. Afterward, the sample was dipped into an aqueous solution of hydrogen fluoride (50% by weight HF) for 10 minutes and rinsed with water.

b) Drive-in Thermal Treatment:

The respective sample was subjected to thermal treatment at a temperature of 1000° C. and over a period of 10 minutes under a nitrogen atmosphere.

c) Storage:

The respective sample was stored at room temperature over a period of 7 days.

d) Measuring the Concentration of Copper Ions:

The copper concentration on the front side of the respective sample was measured on an area of 500×500 μm$^2$ by means of time of flight secondary ion mass spectrometry (TOF-SIMS).

e) Calculating the Getter Efficiency:

The getter efficiency (GE) was calculated in accordance with the formula GE=$(1-C_{Cu}/Ct_{Cu}) \times 100\%$, where $Ct_{Cu}$ is the concentration of copper ions with which the rear side of the sample was contaminated, and $C_{Cu}$ is the concentration of copper ions which was detected on the front side of the sample by means of TOF-SIMS.

In an experiment, the getter efficiency was determined after storage of the sample for 7 days at room temperature.

Results of the experiments are compiled in Tables 1 and 2.

In the Tables:

N+H and –: denote production of the single crystal with and respectively without the doping of the single crystal with nitrogen and hydrogen;

[Oi]: Denotes concentration of interstitial oxygen in the substrate wafer;

post-RTP: denotes further, second thermal treatment after the RTP thermal treatment.

TABLE 1

| Doping with nitrogen and hydrogen | Post-RTP | [Oi] (cm$^{-3}$) | Max. BMD density (cm$^{-3}$) after defect delineation/optical microscopy | Max. BMD density (cm$^{-3}$) (MO-441) | Measured BMD size (nm) (MO-441) | Average DZ (μm) after defect delineation/optical microscopy | Calculated BMD size (nm) | Average DZ (μm) MO-441 | Getter efficiency after storage for 7 days |
|---|---|---|---|---|---|---|---|---|---|
| — | 500-1000° C. 1 K/min + 1000° C. 10 h | $5.4 \times 10^{17}$ | $2.76 \times 10^{10}$ | | 70 | 15 | 73.67 | | 100% |
| — | 500-1000° C. 1 K/min + 1000° C. 8 h | $5.93 \times 10^{17}$ | $4.29 \times 10^{10}$ | | 77 | 15 | 69.08 | | 99% |
| — | 500-950° C. 1 K/min + 950° C. 10 h | $5.4 \times 10^{17}$ | $2.11 \times 10^{10}$ | | 61 | 12 | 50.75 | | 99% |
| — | 500-950° C. 1 K/min + 950° C. 10 h | $5.4 \times 10^{17}$ | | $8.0 \times 10^{9}$ | 61 | | 50.75 | 10 | 99% |
| — | 500-950° C. 1 K/min + 950° C. 8 h | $5.93 \times 10^{17}$ | $2.58 \times 10^{10}$ | | 60 | 6 | 48.25 | | 97% |
| — | 500-950° C. 1 K/min + 950° C. 8 h | $5.93 \times 10^{17}$ | | $8.5 \times 10^{9}$ | 60 | | 48.25 | 8 | 97% |
| N + H | 500-900° C. 5 K/min + 900° C. 8 h | $5.3 \times 10^{17}$ | $1.77 \times 10^{10}$ | | 35 | 5 | 27.51 | | 99% |
| N + H | 500-900° C. 5 K/min + 900° C. 8 h | $5.0 \times 10^{17}$ | $1.39 \times 10^{10}$ | | 34 | 12 | 26.74 | | 99% |
| N + H | 500-950° C. 5 K/min + 950° C. 6 h | $5.3 \times 10^{17}$ | $1.60 \times 10^{10}$ | | 40 | 5 | 38.58 | | 95% |
| N + H | 500-950° C. 5 K/min + 950° C. 6 h | $5.3 \times 10^{17}$ | | $6.5 \times 10^{9}$ | 40 | | | 10 | 95% |

TABLE 2

| Doping with nitrogen and hydrogen | Post RTP | [Oi] (cm$^{-3}$) | Max. BMD density (cm$^{-3}$) after defect delineation/optical microscopy | BMD size (nm) | DZ average (μm) | Getter efficiency after storage for 7 days |
|---|---|---|---|---|---|---|
| — | 500-1000° C. 1 K/min + 1000° C. 0.5 h | 5.4 × 10$^{17}$ | 2.25 × 10$^{10}$ | 29.13 | 20 | 0% |
| — | 500-1000° C. 1 K/min + 1000° C. 0.5 h | 5.93 × 10$^{17}$ | 3.02 × 10$^{10}$ | 30.57 | 15 | 32% |
| — | 500-1000° C. 1 K/min + 1000° C. 2 h | 5.4 × 10$^{17}$ | 1.78 × 10$^{10}$ | 41.31 | 18 | 47% |
| — | 500-950° C. 1 K/min + 950° C. 6 h | 5.4 × 10$^{17}$ | 2.55 × 10$^{10}$ | 40.71 | 10 | 62% |
| — | 500-1000° C. 1 K/min + 1000° C. 1 h | 5.93 × 10$^{17}$ | 3.35 × 10$^{10}$ | 35.34 | 15 | 25% |
| N + H | 500-900° C. 5 K/min + 900° C. 4 h | 5.3 × 10$^{17}$ | 1.20 × 10$^{10}$ | | 10 | 42% |
| N + H | 500-900° C. 5 K/min + 900° C. 4 h | 5.3 × 10$^{17}$ | 1.20 × 10$^{10}$ | | 10 | 33% |
| N + H | 500-900° C. 5 K/min + 900° C. 4 h | 5.3 × 10$^{17}$ | 1.0 × 10$^{10}$ | | 8 | 33% |
| N + H | 500-900° C. 5 K/min + 900° C. 4 h | 5.3 × 10$^{17}$ | 1.0 × 10$^{10}$ | 20.11 | 8 | 8% |
| N + H | 500-900° C. 5 K/min + 900° C. 4 h | 5.0 × 10$^{17}$ | 8.0 × 10$^{9}$ | 19.56 | 7 | 23% |
| N + H | 500-900° C. 5 K/min + 900° C. 4 h | 5.0 × 10$^{17}$ | 8.0 × 10$^{9}$ | | 7 | 32% |
| N + H | 500-900° C. 5 K/min + 900° C. 4 h | 5.0 × 10$^{17}$ | 6.91 × 10$^{9}$ | | 15 | 33% |
| N + H | 500-900° C. 5 K/min + 900° C. 4 h | 5.0 × 10$^{17}$ | 6.91 × 10$^{9}$ | | 15 | 72% |
| — | 500-900° C. 5 K/min + 900° C. 8 h | 5.4 × 10$^{17}$ | 1.14 × 10$^{10}$ | | | 56% |
| — | 500-900° C. 5 K/min + 900° C. 8 h | 5.4 × 10$^{17}$ | 1.06 × 10$^{10}$ | 27.79 | | 26% |
| — | 500-900° C. 5 K/min + 900° C. 8 h | 5.93 × 10$^{17}$ | 1.06 × 10$^{10}$ | 29.11 | | 21% |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A monocrystalline silicon semiconductor wafer having a nitrogen concentration of not more than $1 \times 10^{12}$ atoms/cm$^3$, and when subjected to defect delineation/optical microscopy comprises:
    a denuded zone ("DZ") which extends from a front side of the semiconductor wafer into the bulk of the semiconductor wafer and which is free of BMD defects and has an averaged thickness of not less than 5 μm, and a region which adjoins the DZ and extends further into the bulk of the semiconductor wafer, the region having BMD defects having a size of not less than 50 nm, wherein a depth profile of the BMD defects in the region has a local maximum which is at a distance of not less than 20 μm and not more than 200 μm from the front side of the semiconductor wafer, and wherein the density of the BMD defects at the local maximum is not less than $2 \times 10^{10}$/cm$^3$.

2. A monocrystalline silicon semiconductor wafer, which is doped with nitrogen and hydrogen, and when subjected to defect delineation/optical microscopy comprises:
    a denuded zone ("DZ") which extends from a front side of the semiconductor wafer into the bulk of the semiconductor wafer and which is free of BMD defects and has an averaged thickness of not less than 5 μm, and a region which adjoins the DZ and extends further into the bulk of the semiconductor wafer, the region BMD defects having a size of not less than 25 nm, wherein a depth profile of the BMD defects in the region has a first local maximum which is at a distance of not less than 20 μm and not more than 100 μm from the front side of the semiconductor wafer wherein the density of the BMD defects at the first local maximum is not less than $1.0 \times 10^{10}/cm^3$, and the depth profile of the BMD defects has a second local maximum which is at a distance of not less than 300 µm and not more than 500 µm from the front side of the semiconductor wafer, wherein the density of the BMD defects at the second local maximum is not less than $2 \times 10^{10}/cm^3$.

3. A method for producing a monocrystalline silicon semiconductor wafer of claim 1, having a denuded zone ("DZ") which is free of BMD defects, and having a region having BMD defects which adjoins the DZ, comprising:
  a) pulling a silicon single crystal by the Czochralski method;
  b) processing the single crystal to form a polished monocrystalline substrate wafer which, from a center as far as an edge, consists of an N region or has COP defects, the size of the COP defects being more than 20 nm and having an average density of less than $2.5 \times 10^5/cm^3$, the substrate wafer having a nitrogen concentration of not more than $1 \times 10^{12}$ atoms/cm³ and an oxygen concentration of not less than $5.2 \times 10^{17}$ atoms/cm³ and not more than $6.0 \times 10^{17}$ atoms/cm³;
  c) rapidly heating and cooling the substrate wafer in an atmosphere which substantially consists of $NH_3$ and argon in a volume ratio of not less than 1:25 and not more than 1:5 to a temperature of not less than 1165° C. and not more than 1180° C. and with a heating rate and a cooling rate of not less than 30 K/s and not more than 50 K/s;
  d) slowly heating the rapidly heated and cooled substrate wafer from step c) from a temperature of not less than 500° C. and not more than 550° C. to a temperature of not less than 930° C. and not more than 1000° C. with a heating rate of not less than 0.5 K/min and not more than 1.5 K/min; and
  e) keeping the substrate wafer at the temperature of not less than 930° C. and not more than 1000° C. over a period of not less than 7 hours and not more than 10 hours.

4. A method for producing a monocrystalline silicon semiconductor wafer of claim 2 having a denuded zone ("DZ") which is free of BMD defects, and having a region having BMD defects which adjoins the DZ, comprising:
  a) pulling a silicon single crystal in accordance with the Czochralski method, wherein the growing single crystal is doped with nitrogen and pulled in an atmosphere containing hydrogen;
  b) processing the single crystal to form a polished monocrystalline substrate wafer composed of silicon which, from a center as far as an edge, consists of an N region or has COP defects, the size of which is more than 20 nm and the average density of which is less than $2.5 \times 10^5/cm^3$, the substrate wafer having a nitrogen concentration of not less than $3 \times 10^{13}$ atoms/cm³ and not more than $3 \times 10^{14}$ atoms/cm³ and an oxygen concentration of not less than $5.0 \times 10^{17}$ atoms/cm³ and not more than $5.8 \times 10^{17}$ atoms/cm³;
  c) rapidly heating and cooling the substrate wafer in an atmosphere which substantially consists of $NH_3$ and argon in a volume ratio of not less than 1:25 and not more than 1:5 to a temperature of not less than 1165° C. and not more than 1180° C. and with a heating rate and a cooling rate of not less than 30 K/s and not more than 50 K/s;
  d) slowly heating the rapidly heated and cooled substrate wafer from step c) from a temperature of not less than 500° C. and not more than 550° C. to a temperature of not less than 900° C. and not more than 1000° C. with a heating rate of not less than 3 K/min and not more than 7 K/min; and
  keeping the substrate wafer at the temperature of not less than 900° C. and not more than 1000° C. over a period of not less than 5 hours and not more than 8 hours.

5. The method of claim 3, wherein the method comprises no additional thermal treatments of the substrate wafer which subject the substrate wafer to temperatures of more than 1000° C.

6. The method of claim 4, wherein the method comprises no additional thermal treatments of the substrate wafer which subject the substrate wafer to temperatures of more than 1000° C.

7. The method of claim 4, wherein the growing single crystal is pulled in an atmosphere containing hydrogen having a partial pressure of not less than 10 Pa and not more than 80 Pa.

8. The method of claim 6, wherein the growing single crystal is pulled in an atmosphere containing hydrogen having a partial pressure of not less than 10 Pa and not more than 80 Pa.

* * * * *